(12) United States Patent
Weigert (10) Patent No.: US 7,417,292 B2
(45) Date of Patent: Aug. 26, 2008

(54) ARRANGEMENT FOR CONNECTING THE TERMINAL CONTACTS OF AN OPTOELECTRONIC COMPONENT TO A PRINTED CIRCUIT BOARD

(75) Inventor: Martin Weigert, Bernhardswald (DE)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 10/817,583

(22) Filed: Apr. 2, 2004

(65) Prior Publication Data

US 2005/0062123 A1  Mar. 24, 2005

Related U.S. Application Data

(60) Provisional application No. 60/505,568, filed on Sep. 23, 2003.

(51) Int. Cl.
*H01L 33/00* (2006.01)
(52) U.S. Cl. .................. 257/433; 257/E23.055
(58) Field of Classification Search .......... 257/433, 257/E23.055
See application file for complete search history.

(56) References Cited

U.S. PATENT DOCUMENTS

| | | | | |
|---|---|---|---|---|
| 3,104,282 A | * | 9/1963 | Horn et al. .................. 348/838 |
| 5,243,453 A | * | 9/1993 | Kawaguchi et al. .......... 349/60 |
| 5,387,125 A | * | 2/1995 | Davis et al. .................. 439/497 |
| 2002/0139289 A1 | * | 10/2002 | Barmet ........................ 116/64 |
| 2003/0111701 A1 | * | 6/2003 | Yoo et al. .................... 257/433 |
| 2004/0108809 A1 | * | 6/2004 | Heo et al. .................... 313/506 |

FOREIGN PATENT DOCUMENTS

DE  100 64 577 A1  7/2002

* cited by examiner

*Primary Examiner*—Thomas L Dickey
(74) *Attorney, Agent, or Firm*—Workman Nydegger (57) ABSTRACT

An arrangement for connecting the terminal contacts of an optoelectronic component to electrical contacts of a printed circuit board using a flexible conductor arrangement. The flexible conductor arrangement has a planar form and includes a plurality of interconnects that are arranged to provide an electrical connection between the terminal contacts of the optoelectronic component and the electrical contacts of the printed circuit board. The flexible conductor arrangement is bent in such a way that, starting from the printed circuit board, it is led around the optoelectronic component and contacts the latter on a side facing away from the printed circuit board.

21 Claims, 9 Drawing Sheets

ARRANGEMENT FOR CONNECTING THE TERMINAL CONTACTS OF AN OPTOELECTRONIC COMPONENT TO A PRINTED CIRCUIT BOARD

RELATED APPLICATION

The present application claims priority of U.S. Provisional Patent Application Ser. No. 60/505,568 filed by Martin Weigert on Sep. 23, 2003.

FIELD OF THE INVENTION

The invention relates to an arrangement for connecting the terminal contacts of an optoelectronic component to a printed circuit board using a flexible conductor. It relates in particular to the exact arrangement of a flexible conductor with respect to the optoelectronic component and the printed circuit board.

BACKGROUND OF THE INVENTION

It is known from DE 100 64 577 A1 to solder the terminal pins of a TO package which contains an optoelectronic component directly to a printed circuit board. Since both the printed circuit board and the TO package are fixed in a common housing (usually a transceiver housing), inadmissibly high mechanical stresses can occur, however, at the soldering points due to mechanical tolerances and thermal expansion.

Furthermore, it is known to connect the terminal pins of a TO package with a flexible conductor (e.g., a flexible flat cable). Flexible conductors are arrangements known in the prior art in which interconnects have been applied to one, both or several sides of a flexible, insulating substrate. The connection between the terminal pins of a TO package and a flexible conductor takes place by means of via holes in the flexible conductor, through which the terminal pins are inserted. Flexible conductors have the advantage that they have favorable RF properties at high frequencies in the GHz range. In addition, they allow compensation for tolerances with regard to the arrangement of an optoelectronic component with respect to a printed circuit board.

Figure 9:
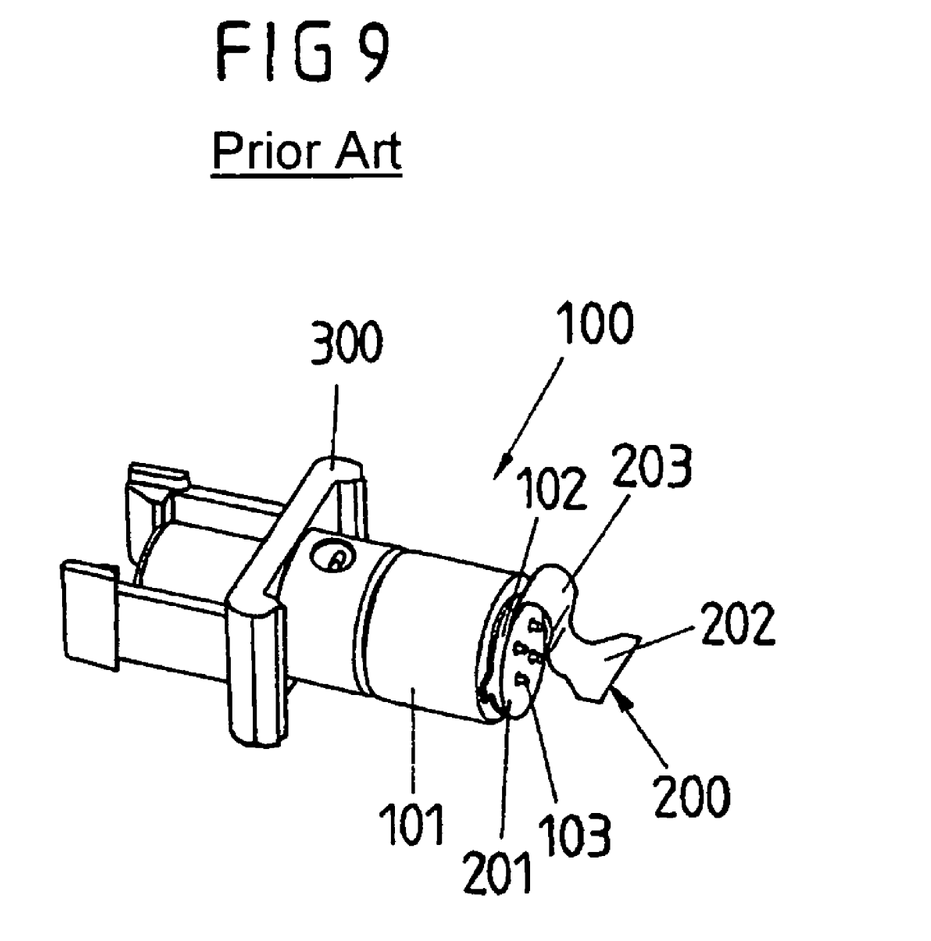
FIG. 9 shows an optoelectronic component known in the prior art, with a flexible conductor for the electrical connection of the optoelectronic component.

An arrangement with a flexible conductor known in the prior art for the electrical connection of an optoelectronic component to a printed circuit board is represented in FIG. 9. The optoelectronic component formed as an electro-optical converter 100 has a TO package 101, in which optoelectronic components such as an optical transmitting module and/or an optical receiving module which emit or receive light modulated in a way corresponding to data to be transmitted are arranged in a known way. The TO package 101 is adjoined by a plug unit 300 for an optical plug, in the exemplary embodiment represented for a SC plug (SC=subscriber connector).

An electrical connection to a printed circuit board (not shown), which is located for example in an optoelectronic transceiver and contains additional electronic components such as capacitors, resistors and integrated circuits such as driver modules and preamplifier modules, takes place by means of a flexible conductor 200.

Terminal pins 103 protrude perpendicularly from a base plate 102 of the TO package 101. The flexible conductor 200 runs parallel to the base plate 102 of the TO package 101 at its end 201 facing the TO package 101 and, in this region 201, contacts the terminal pins 103. The end 202 to be brought into electrical contact with a printed circuit board, on the other hand, runs perpendicularly in relation to the base plate 102. It is accordingly required to bend the flexible conductor 200 between these two ends 201, 202, producing a bent region 203. On account of a minimum bending radius of the flexible conductor 200, the size of which depends on the type of flexible conductor, a certain installation space is required for the bent region 203, which leads to an undesired additional space requirement. It is desirable to arrange the optoelectronic components in a way that saves as much space as possible.

SUMMARY OF THE INVENTION

The present invention is directed to an arrangement for connecting the terminal contacts of an optoelectronic component to a printed circuit board which is particularly space-saving and requires little installation space.

According to an aspect of the invention, by arrangement includes an optoelectronic component with terminal contacts, a printed circuit board with electrical contacts, and a flexible conductor arrangement of a planar form having a plurality of interconnects (conductive traces or wires), where the conductor arrangement is connected to the optoelectronic component and the printed circuit board such that the interconnects provide an electrical connection between the terminal contacts of the optoelectronic component and the electrical contacts of the printed circuit board. According to an aspect of the invention, the flexible conductor arrangement is bent in such a way that, starting from the printed circuit board, it is led around the optoelectronic component and contacts the latter on a side facing away from the printed circuit board (i.e., the flexible conductor arrangement is connected to the printed circuit board at a point located between the circuit board and a first side of the optoelectronic component facing the printed circuit board, extends around the optoelectronic component, and is connected to the second side of the optoelectronic component facing away from the printed circuit board).

The solution according to the invention is consequently distinguished by the idea that the optoelectronic component is located within the region which is necessarily produced when bending the flexible conductor arrangement by virtue of the fact that the flexible conductor arrangement has a minimum bending radius. Consequently, the region produced by bending the flexible conductor arrangement is functionally used. It serves for at least partly receiving the optoelectronic component and is not unused, as in the prior art. This allows installation space to be saved to a considerable extent.

It is pointed out that, for the purposes of the present invention, an optoelectronic component is understood as meaning any optoelectronic or electro-optical component which has a light-generating or light-receiving element.

In a preferred configuration of the invention, the flexible conductor arrangement has a first portion with contact regions for the connection to associated electrical contacts of the printed circuit board and a second portion with contact regions for the connection to the terminal contacts of the optoelectronic component. The conductor arrangement is in this case bent at least in a third portion lying between the first portion and the second portion.

This third portion of the flexible conductor arrangement preferably has in this case at least one region of maximum curvature. In the region of maximum curvature, the conductor arrangement has a bending radius which is equal to or greater than a minimum bending radius, which fixes a maximum permissible curvature of the conductor arrangement. The optoelectronic component is in this case preferably arranged at least partly between two subregions of the conductor arrangement which adjoin the region of maximum curvature of the conductor arrangement. It is particularly preferred for the subregions of the conductor arrangement adjoining the region of maximum curvature to run at least partly parallel, the at least partly parallel-running subregions being at a distance from each other which is greater than the thickness of the optoelectronic component. There is consequently a kind of U shape of the conductor arrangement, the optoelectronic component being located at least partly between the two limbs of the U shape. This permits a particularly space-saving arrangement.

For contacting purposes, the optoelectronic component preferably has a leadframe, the contact regions of the second portion of the conductor arrangement respectively being in connection with a leg of the leadframe.

In a further preferred configuration, the optoelectronic component has an optical window for light to enter or light to leave and this optical window is arranged on the side of the optoelectronic component facing away from the printed circuit board. The flexible conductor arrangement then has, at least in the region of the optical window, a clearance for light to pass through.

There are several possibilities for the arrangement of the conductor arrangement on the printed circuit board. In a first configuration, the first portion of the conductor arrangement, connected to the printed circuit board, runs parallel to the surface of the printed circuit board. In a second configuration, the first portion of the conductor arrangement, connected to the printed circuit board, is arranged on the end face of the printed circuit board and accordingly runs perpendicularly in relation to the surface of the printed circuit board.

A development of the invention additionally provides a mounting element, which with its one side is connected to the side of the optoelectronic component facing away from the printed circuit board and with its other side provides a mechanical interface, for instance for a mechanical connection to a plug receptacle, into which an optical plug can be inserted. In this configuration, the flexible conductor arrangement preferably has a clearance in the region between the optoelectronic component and the associated side of the mounting element.

BRIEF DESCRIPTION OF THE DRAWINGS

The invention is explained in more detail below on the basis of an exemplary embodiment with reference to the figures, in which.

DESCRIPTION OF PREFERRED EXEMPLARY EMBODIMENTS

Figure 1:
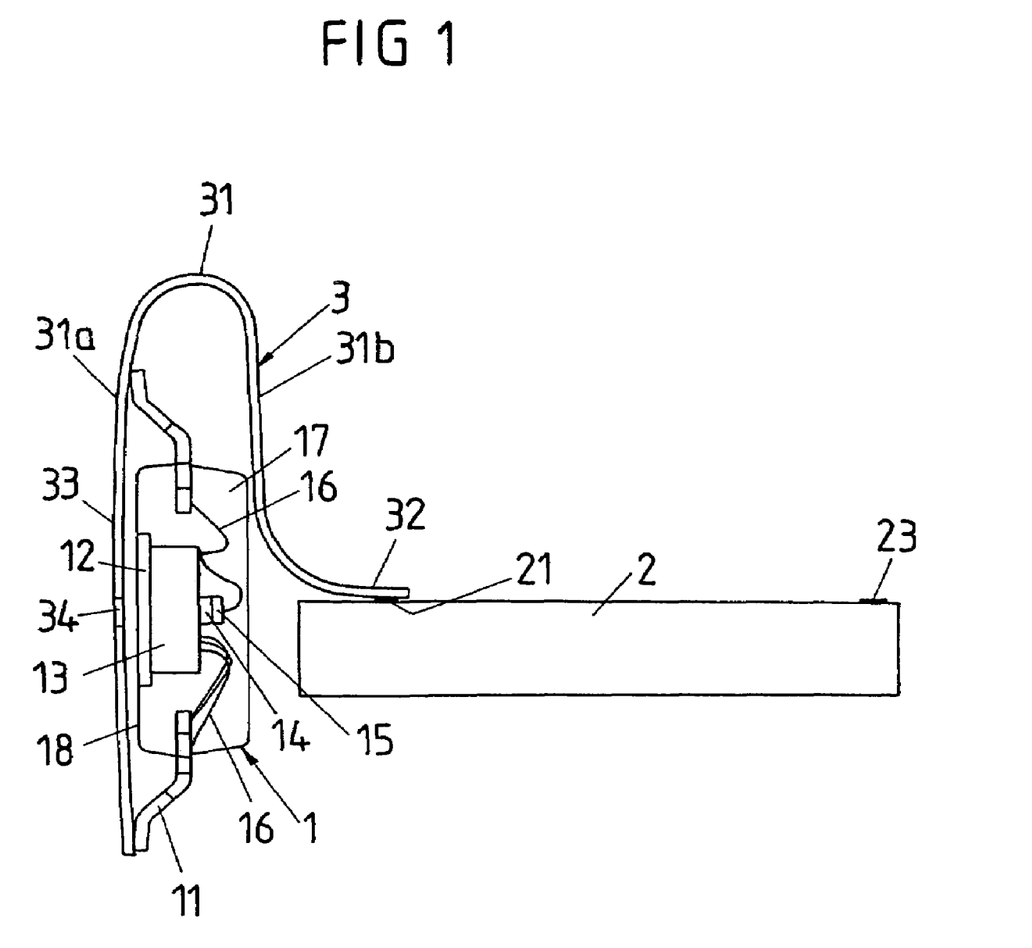
FIG. 1 shows in side view a first exemplary embodiment of an arrangement with an opto-electronic component, a flexible conductor and a printed circuit board, the flexible conductor being fastened on the surface of the printed circuit board.
Figure 3:
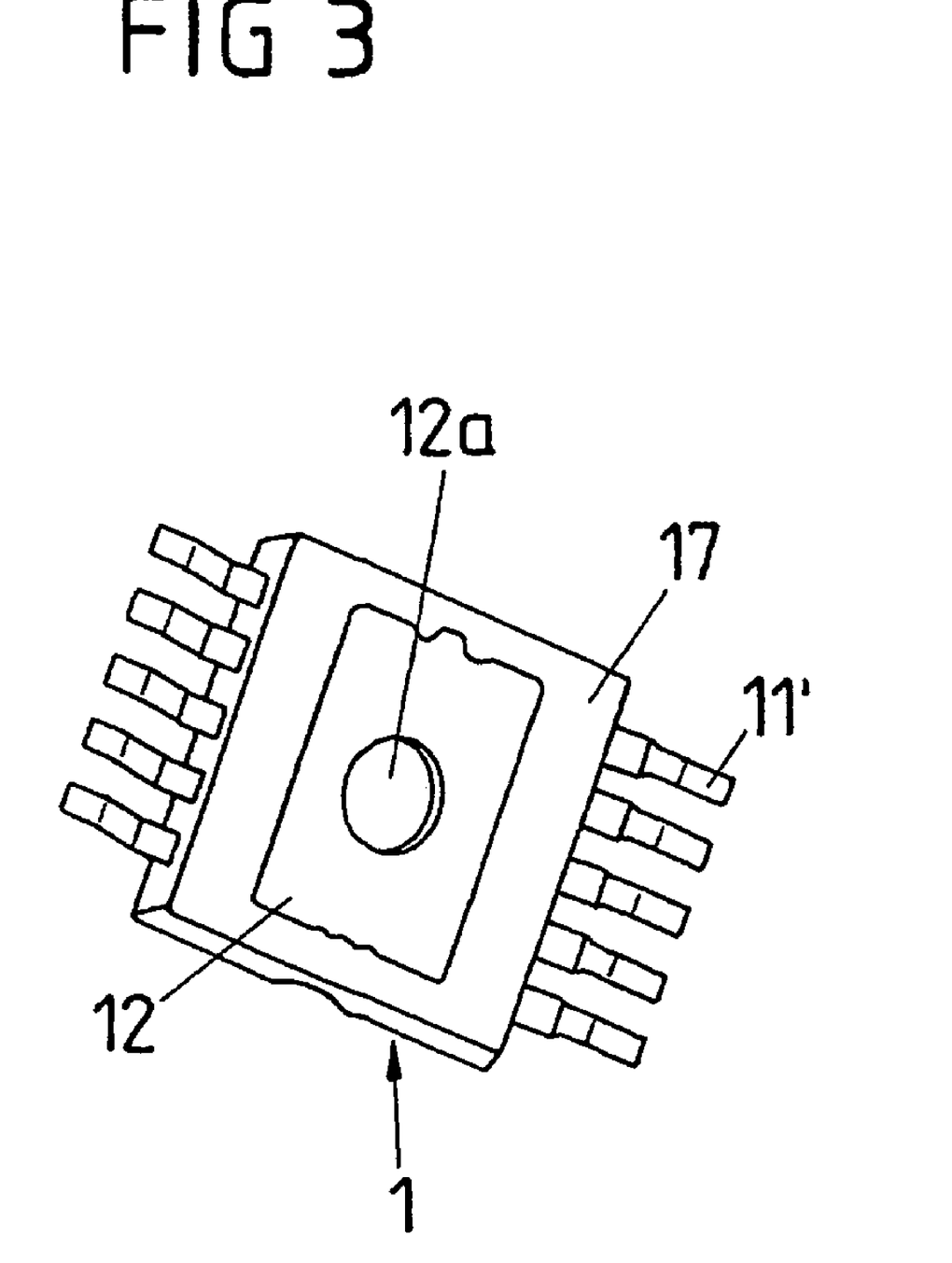
FIG. 3 shows a perspective representation of the underside of the optoelectronic component of FIGS. 1, 2.

FIG. 1 shows an arrangement with an optoelectronic component 1, a printed circuit board 2 and a flexible conductor (flexible flat cable) 3. FIG. 3 shows the optoelectronic component 1 of FIG. 1 in a perspective view from below.

In the exemplary embodiment represented, the optoelectronic component 1 is an optoelectronic transmitting device with a laser diode 14, which is arranged on a supporting substrate 13 which is optically transparent to the light emitted and radiates light in the direction of the supporting substrate 13. The supporting substrate 13 consists of silicon, for example. Arranged on the rear side of the laser diode 14 is a monitor diode 15, which detects a fraction of the light emitted from the laser diode 14 for monitoring purposes.

The electrical contacting of the individual components 14, 15 takes place by means of a leadframe 11 with a plurality of leadframe legs 11', cf. FIG. 3. For the electrical contacting of the laser diode 14 and the monitor diode 15, bonding wires 16 are provided.

The supporting substrate 13 is arranged on a metallic base plate (die pad) 12 of the leadframe 11. The entire arrangement is encapsulated in an optically non-transparent encapsulating material, which forms a housing 17 of the optoelectronic component 1. As illustrated by FIG. 3, the base plate 12 has in this case a clearance 12a, which provides an optical window for light to enter or light to leave.

The printed circuit board 2 has schematically represented contact pads 21 for the electrical activation and connection of the optoelectronic component 1. Additionally arranged on the printed circuit board 2 are electronic components (not represented), in particular a driver module for the optoelectronic component 1 (or a preamplifier if the optoelectronic component 1 is formed as a receiving element), capacitors, resistors, etc.

The printed circuit board 2 preferably represents a transceiver board of an electro-optical converter. It has at its one end electrical terminals in the form of contact pads 23 for connection to a main circuit board. This electrical connection region 23, which is only schematically represented in FIG. 1, is preferably of an insertable form.

In the present context, it is of significance that the printed circuit board 2 is electrically connected by means of the flexible conductor 3 to the optoelectronic component 1 or its electrical contacts provided by the leadframe legs 11'. The flexible conductor 3 has in this case a plurality of interconnects, which are arranged in or on a flexible dielectric, it being possible for the flexible conductor to be of a one-layered, two-layered or else multi-layered form. For example, the flexible conductor is of a two-layered form, one layer comprising the interconnects and the other layer comprising a ground layer.

The flexible conductor 3 has a first end portion 32, which serves for the connection of the flexible conductor to the printed circuit board 2. For this purpose, arranged on the one surface of the end portion 32 are a multiplicity of contact pads (contact regions), by means of which an electrical connection to the corresponding contact pads 21 of the printed circuit board 2 can be established.

The flexible conductor 3 has a second end portion 33, which serves for the connection to the leadframe legs 11'. For this purpose, corresponding contact pads are again arranged on the surface of the second end portion 33.

Starting from the end portion 32, which is connected to the printed circuit board 2, the flexible conductor 3 is bent in such a way that it is led around one side of the optoelectronic component 1 and contacts the latter on the side 18 facing away from the printed circuit board 2. In other words, the optoelectronic component 1 is partly located within the bending radius of the flexible conductor 3. In this case, the flexible conductor 3 has a third portion, which extends between first portion 32 and second portion 33, and which includes a region 31 of maximum curvature (bent region). This region 31 is adjoined by regions 31a, 31b, also part of the third portion, which run substantially parallel to each other and are at such a distance that the optoelectronic component 1 can just be received between them.

The maximum curvature of the flexible conductor 3 in the region 31 is in this case prescribed by a minimum bending radius, which is prescribed by the manufacturer in dependence on the formation of the flexible conductor and is to be maintained for reasons of reliability. Parameters which determine the minimum bending radius are in this case the formation of the flexible board with one, two or more layers and the material used, on or in which the individual interconnects have been incorporated.

It is pointed out that the flexible conductor 3 has in the region which lies opposite the clearance 12a in the base plate 12 of the optoelectronic component 1 a schematically represented clearance 34, so that an opening for light to pass through is provided.

Figure 2:
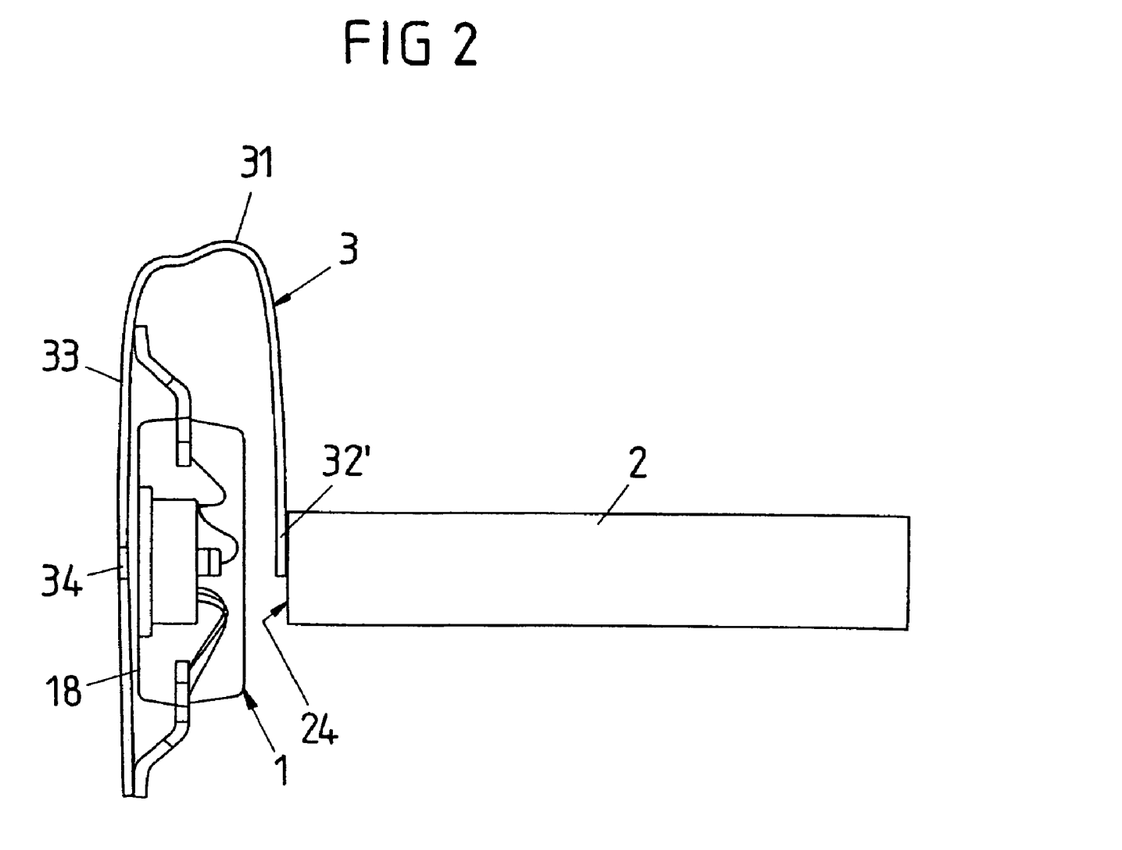
FIG. 2 shows in side view a second exemplary embodiment of an arrangement with an opto-electronic component, a flexible conductor and a printed circuit board, the flexible conductor being fastened on the end face of the printed circuit board.

The exemplary embodiment of FIG. 2 differs from the exemplary embodiment of FIG. 1 to the extent that, in its first end region 32', the flexible conductor 3 is arranged on the end face 24 of the printed circuit board 2. In the case of this exemplary embodiment, the printed circuit board 2 accordingly forms its electrical contacts for the contacting of the flexible conductor 3 on the end face (side edge) 24, which extends perpendicularly between the upper and lower surfaces of printed circuit board 2. For this purpose, it may be provided that the contact pads 21 on the upper side of the printed circuit board extend onto the edge of the printed circuit board. Contacting with respect to the flexible conductor 3 arranged on the end face is then provided by means of a solder. The solder is located as it were in the corner which is formed by the printed circuit board and the flexible conductor.

The exemplary embodiment of FIG. 2 also illustrates that the flexible conductor may have curvature variations in the region 31 of maximum curvature. The curvature consequently does not by any means have to increase steadily at first and then decrease steadily again. The flexible conductor as a whole is led around the optoelectronic component 1 and onto the side 18 facing away from the printed circuit board 2. The optoelectronic component 1 is arranged in the U shape, or approximate U shape, of the flexible conductor thereby produced, so that a considerable reduction of the installation space required is made possible.

FIGS. 4 to 8 show an actual exemplary embodiment of the arrangement of FIG. 2, although the printed circuit board is not represented in any of these and, in FIGS. 4 to 7, the flexible conductor has not yet been bent in a way corresponding to FIGS. 1 and 2.

Figure 4:
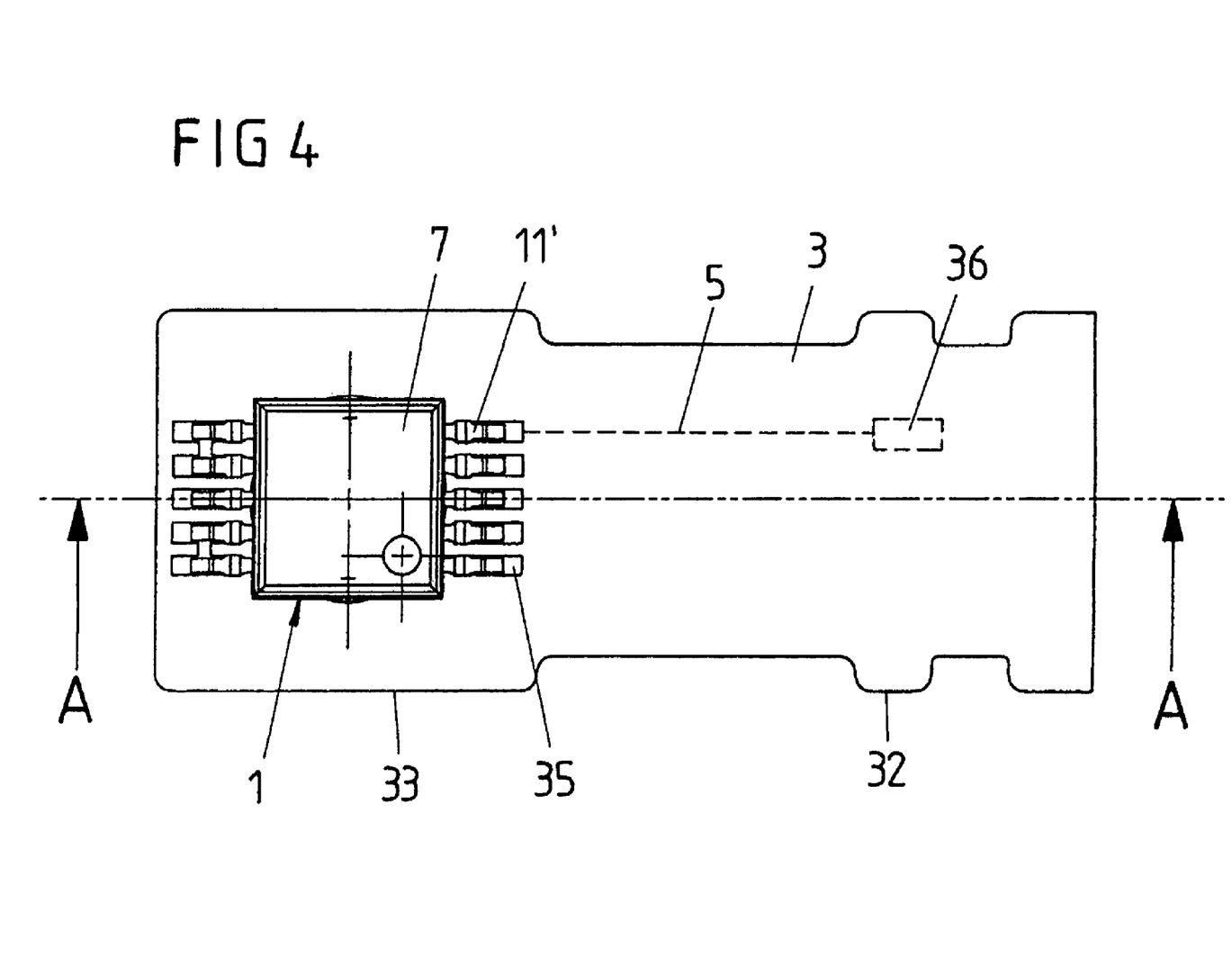
FIG. 4 shows a plan view of an arrangement with a flexible conductor and an optoelectronic component arranged on the flexible conductor, with leadframe contacting.

The plan view of FIG. 4 shows the optoelectronic component 1 with the leadframe legs 11' protruding laterally from the housing 7. The optoelectronic component 1 is arranged on the flexible conductor 3. For this purpose, the flexible conductor 3 has in the second end portion 33, which serves for the contacting with respect to the optoelectronic component 1, a multiplicity of electrical contact regions or contact pads 35. The contact pads 35 are also well illustrated in the perspective representation of FIG. 6.

The actual interconnects, which end at the respective contact pads 35, cannot be seen in FIG. 4, since in the case of the configuration represented they are covered by a layer of resist. Only one interconnect 5 is schematically indicated, the other end of which ends in a contact pad 36 in the portion 32 of the flexible conductor, which serves for the connection to a printed circuit board.

It should be noted at this point that the flexible conductor 3 has a planar form, i.e. the thickness of the flexible conductor is small in comparison with the linear extent and lateral extent. Apart from the bending of the flexible conductor, the interconnects lie in one plane.

Figure 5:
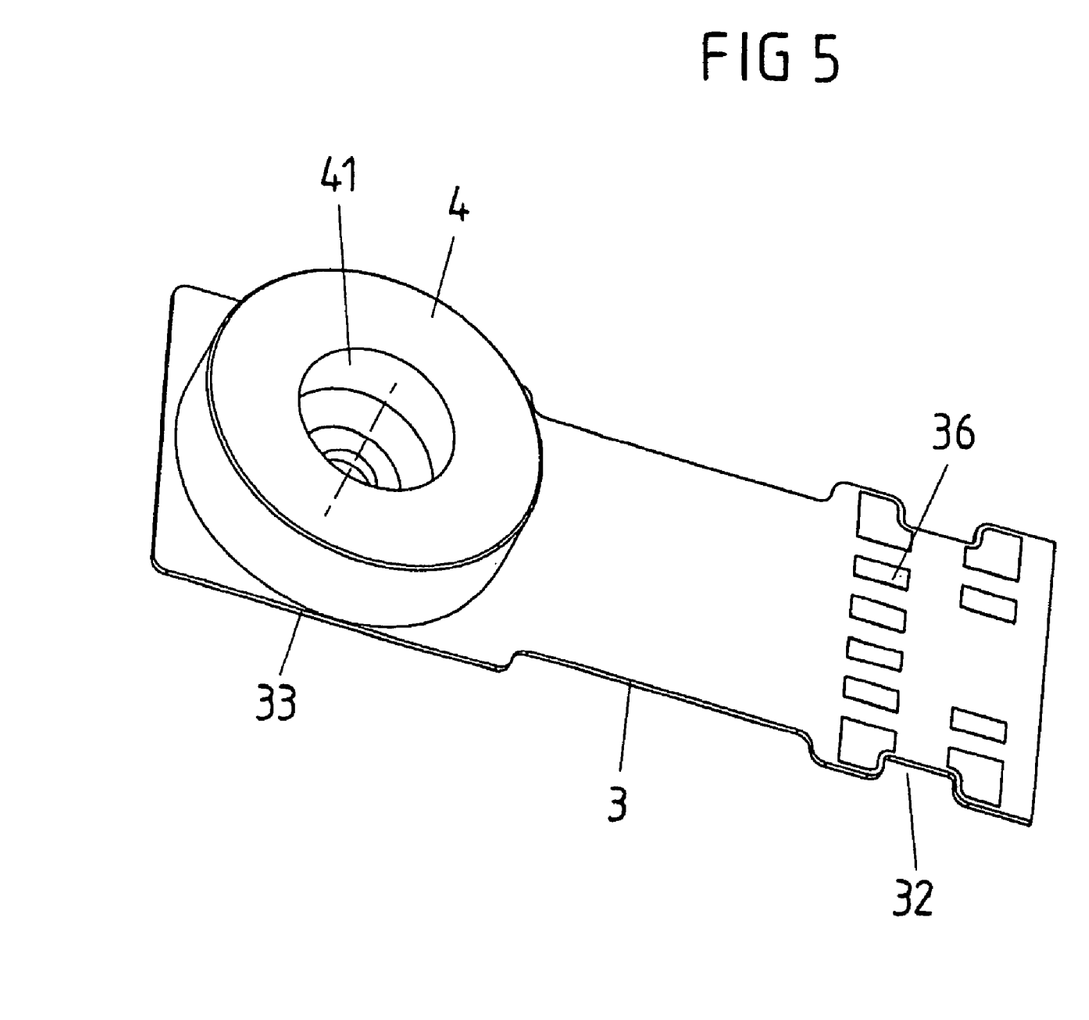
FIG. 5 shows a perspective view from below of the flexible conductor of FIG. 4, additionally illustrating a mounting element.

FIG. 5 shows the flexible conductor in a view from below. This illustrates firstly the contact regions or contact pads 36 of the first end portion 32 of the flexible conductor, which serves for the connection of the flexible conductor to the printed circuit board. In this respect it is pointed out that these contacts 36 lie on the opposite side of the flexible conductor from the contacts 35, which serve for the connection to the optoelectronic component, cf. FIG. 4.

Figure 7:
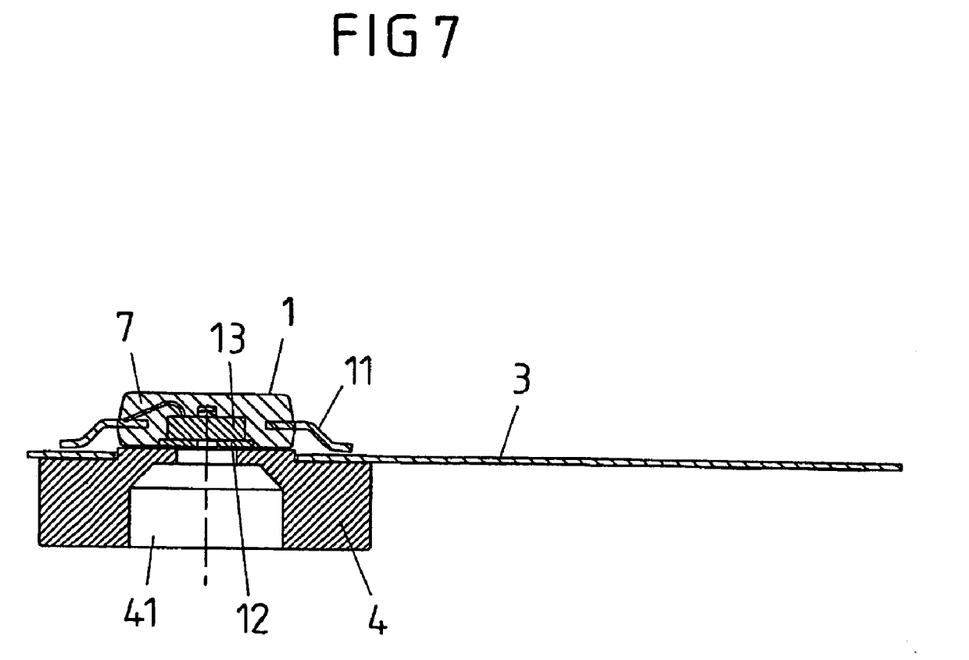
FIG. 7 shows a sectional view of the arrangement of FIG. 4 along the line A-A.

Also represented in FIG. 5 is a circular mounting element 4, which preferably consists of metal and is connected to the base plate 12 of the converter module 1, cf. the sectional representation of FIG. 7. The mounting part 4 serves on the one hand as a heat sink for the converter module 1. On the other hand, the side of the mounting element facing away from the component 1 provides a mechanical interface for the mechanical coupling of further components, in particular a plug receptacle. The mounting element has in this case a central clearance 41 for light to pass through.

Figure 6:
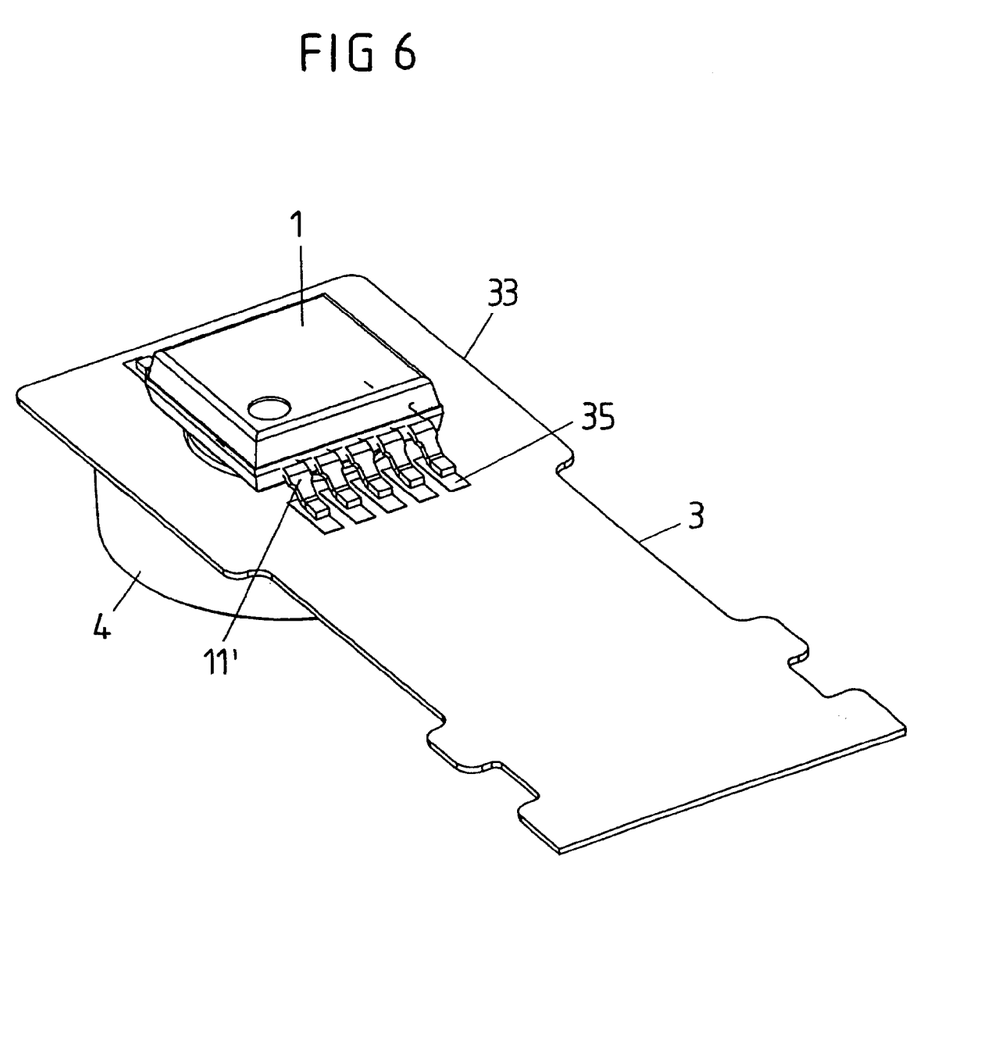
FIG. 6 shows a perspective view of the arrangement of FIG. 4.

The perspective representation of FIG. 6 and the sectional representation of FIG. 7 illustrate that the mounting element 4 directly adjoins the base plate 12 and partly also the underside of the housing 7. In this region, the flexible conductor 3 has a clearance. In this case it may also be provided that the flexible conductor is likewise fastened on the mounting element 4, or at least partly arranged between the mounting element 4 and the optoelectronic component 1, in order to provide an improved mechanical connection to the optoelectronic component 1, which otherwise takes place only by means of the contact pads 35.

Figure 8:
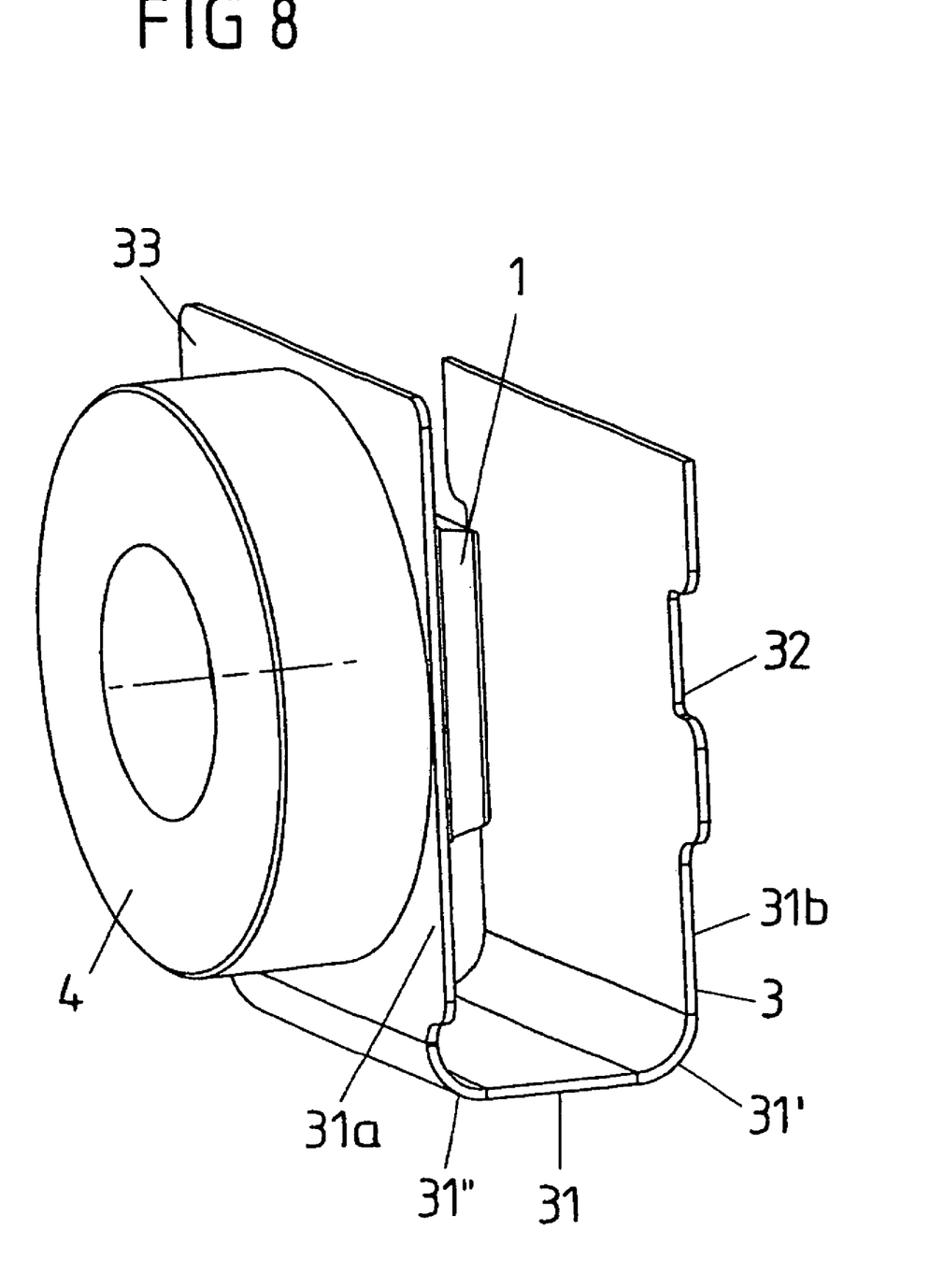
FIG. 8 shows the arrangement of FIGS. 4 to 7 with a flexible conductor bent in a U-shaped manner, in a perspective view.

FIG. 8 shows the arrangement of the flexible conductor 3, optoelectronic component 1 and mounting element 4 after bending of the flexible conductor 3 in a way corresponding to FIGS. 1 and 2. The contact pads, arranged on the outer side of the portion 32, are in this case connected to a printed circuit board, cf. FIGS. 1 and 2. The optoelectronic component 1 is located in the region between the two parallel-running limbs 31a, 31b of the flexible conductor, which adjoin the region 31 of maximum curvature, this region being defined in the exemplary embodiment of FIG. 8 by two edges 31', 31" and a base running between them. The two parallel limbs 31a, 31b merge with or include the first and second end portions 32, 33.

By means of the mounting element 4, the arrangement can be coupled onto an optical plug receptacle or some other coupling part.

It is pointed out that, in alternative configurations, a mechanical supporting element, for instance a metal sheet, is laminated onto or into the flexible conductor 3, or the flexible conductor has an additional or thicker copper layer for the mechanical stabilization of the flexible conductor. The mechanical stability achieved as a result allows the optoelectronic component also to be mechanically coupled to the printed circuit board in an improved manner by means of the flexible conductor.

The invention is not restricted in its configuration to the exemplary embodiments presented above, which are to be understood as only given by way of example. A person skilled in the art recognizes the existence of numerous alternative variants for the embodiment, which, in spite of their departure from the exemplary embodiments described, make use of the teaching defined in the claims which follow.

I claim:

1. An arrangement comprising:
   an optoelectronic component comprising terminal contacts and an optical window through which light can enter or leave the optoelectronic component,
   a printed circuit board with electrical contacts, and
   a flexible conductor including a plurality of interconnects, where the flexible conductor is connected to the optoelectronic component and the printed circuit board such that the interconnects electrically connect the terminal contacts of the optoelectronic component and corresponding electrical contacts of the printed circuit board, an opening being defined in the flexible conductor and arranged for optical communication with the optoelectronic component by way of the window, and the flexible conductor including a bend configured and arranged such that a portion optoelectronic component resides in a region defined by the bend.

2. The arrangement as claimed in claim 1, the flexible conductor having a first portion with contact regions connected to the electrical contacts of the printed circuit board and a second portion with contact regions connected to the terminal contacts of the optoelectronic component, and the flexible conductor being bent at least in a third portion lying between the first portion and the second portion.

3. The arrangement as claimed in claim 2, wherein the optoelectronic component includes a leadframe for contacting purposes, and wherein the respective contact regions of the second portion of the flexible conductor are each electrically connected to a corresponding leg of the leadframe.

4. The arrangement as claimed in claim 2, wherein the first portion of the flexible conductor runs substantially parallel to the surface of the printed circuit board.

5. The arrangement as claimed in claim 2, the first portion of the conductor arrangement, connected to the printed circuit board, being arranged on the end face of the printed circuit board and running perpendicularly in relation to the surface of the printed circuit board.

6. The arrangement as claimed in claim 1, wherein the plurality of interconnects of the flexible conductor are arranged in a flexible dielectric.

7. The arrangement as recited in claim 1, wherein the optoelectronic component includes a laser arranged for optical communication with the optical window and with the opening defined in the flexible conductor.

8. The arrangement as recited in claim 7, further comprising a monitor diode arranged for optical communication with the laser.

9. The arrangement as recited in claim 1, further comprising a leadframe that is electrically connected to the flexible conductor and to the optoelectronic component.

10. The arrangement as recited in claim 1, wherein the flexible conductor comprises a multi-layered form.

11. The arrangement as recited in claim 1, wherein the printed circuit board comprises a transceiver board of an electro-optical converter.

12. The arrangement as recited in claim 1, wherein the optoelectronic component includes a receiving element.

13. The arrangement as recited in claim 1, wherein the optoelectronic component is arranged on the flexible conductor.

14. The arrangement as recited in claim 13, wherein the flexible conductor includes a plurality of contact pads which are physically connected to a leadframe of the optoelectronic component.

15. An arrangement comprising:
   an optoelectronic component comprising terminal contacts and an optical window through which light can enter or leave the optoelectronic component,
   a printed circuit board with electrical contacts, and
   a flexible conductor of a planar form and including a plurality of interconnects, where the flexible conductor is connected to the optoelectronic component and the printed circuit board such that the interconnects electrically connect the terminal contacts of the optoelectronic component and corresponding electrical contacts of the printed circuit board,
   wherein the flexible conductor is bent in such a way that, starting from the printed circuit board, the flexible conductor is led around the optoelectronic component and contacts the optoelectronic component on a side facing away from the printed circuit board and upon which the optical window is arranged,
   wherein an opening is defined in the flexible conductor through which light can enter or leave the optoelectronic component, the opening defined opposite the optical window,
   wherein the flexible conductor has a first portion with contact regions connected to the electrical contacts of the printed circuit board and a second portion with contact regions connected to the terminal contacts of the optoelectronic component, and the flexible conductor being bent at least in a third portion lying between the first portion and the second portion, wherein the third portion has at least one region of maximum curvature.

16. The arrangement as claimed in claim 15, the flexible conductor having in the region of maximum curvature a bending radius which is equal to or greater than a minimum bending radius, which fixes a maximum permissible curvature of the flexible conductor.

17. The arrangement as claimed in claim 15, the optoelectronic component being arranged at least partly between two subregions of the flexible conductor which adjoin the region of maximum curvature of the flexible conductor.

18. The arrangement as claimed in claim 17, the subregions of the flexible conductor adjoining the region of maximum curvature running at least partially parallel.

19. The arrangement as claimed in claim 18, the at least partially parallel-running subregions of the flexible conductor being at a distance from each other which is greater than a thickness of the optoelectronic component.

20. An arrangement comprising:
   a printed circuit board including an electrical contact;
   an optoelectronic component mounted to the printed circuit board such that a first side faces toward the printed circuit board and a second side faces away from the printed circuit board, wherein the optoelectronic component includes a terminal contact formed on the second side, and
   a flexible flat cable including a first contact region located adjacent to a first end portion, a second contact region located adjacent to a second end portion, and an elongated conductor extending between the first and second contact regions along a third portion of the flexible flat cable that extends between the first end portion and the second end portion, wherein the flexible flat cable is connected between the printed circuit board and the optoelectronic component such that the first contact region is connected to the electrical contact of the printed circuit board at a point adjacent to the first side of the optoelectronic component, the second contact region is connected to the terminal contact on the second side of the optoelectronic component, and the third portion of the flexible cable extends around the optoelectronic component, wherein the first end portion, the third portion, and the second end portion define an approximate U shape in the flexible conductor arrangement, and wherein at least a portion of the optoelectronic component is located within the approximate U shape of the flexible conductor arrangement.

21. An arrangement comprising:

a printed circuit board;

an optoelectronic component mounted to the printed circuit board such that a first side faces toward the printed circuit board and a second side faces away from the printed circuit board, and a flexible flat cable including a first end portion connected to the printed circuit board, a second end portion connected to the second side of the optoelectronic component such that substantially the entire length and width of the second side of the optoelectronic component is adjacent to the second end portion, and a third portion extending between the first and second end portions, wherein the third portion defines a bent region, a first straight region extending between the bent region and the first end portion, a second straight region extending between the bent region and the second end portion, and wherein the first and second straight regions are substantially parallel.

* * * * *